(12) United States Patent
Kong (10) Patent No.: US 7,575,954 B2
(45) Date of Patent: Aug. 18, 2009

(54) CERAMIC SUBSTRATE AND METHOD OF BREAKING SAME

(75) Inventor: Xiao-Hua Kong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 553 days.

(21) Appl. No.: 11/323,269

(22) Filed: Dec. 30, 2005

(65) Prior Publication Data

US 2006/0223228 A1    Oct. 5, 2006

(30) Foreign Application Priority Data

Mar. 29, 2005  (CN) .................. 2005 1 0033911

(51) Int. Cl.
*H01L 21/44* (2006.01)
*H01L 21/48* (2006.01)

(52) U.S. Cl. .................. 438/113; 438/114; 438/462; 257/E23.009

(58) Field of Classification Search .................. 438/113, 438/114, 460, 462, 465; 257/E23.118, E23.009
See application file for complete search history.

(56) References Cited

U.S. PATENT DOCUMENTS 6,420,244 B2    7/2002   Lee
2004/0266051 A1*  12/2004  Kojima et al. .................. 438/57

* cited by examiner

*Primary Examiner*—Thanhha Pham (57) ABSTRACT

A ceramic substrate (100) includes a top surface, a plurality of identification marks (104), a protective compound (110), a bottom surface, and a plurality of grooves (106). The top surface includes a first area and a second area. The first area is defined at one or more edges portions of the top surface. The second area is defined inside the first area. The identification marks are arranged on the first area. The protective compound is covered on the second area. The grooves are defined at the bottom surface, and corresponding to the identification marks. A related method for breaking a ceramic substrate includes: (a) pasting one or more tapes on the first area; (b) covering protective compound on the second area; (c) removing the tapes; (d) cutting the protective compound according to the identification marks; and (e) breaking the ceramic substrate into individual circuit unit pieces along the grooves.

14 Claims, 7 Drawing Sheets

(Related Art)

FIG. 13

(Related Art)

FIG. 14

(Related Art)

FIG. 15

(Related Art)

CERAMIC SUBSTRATE AND METHOD OF BREAKING SAME

BACKGROUND OF THE INVENTION

1. Field of the Invention

The present invention generally pertains to semiconductor packages, and more particularly to a ceramic substrate containing semiconductor units and a method for breaking the same.

2. Prior Art

The major trend in the semiconductor industry today is to make products lighter, smaller, faster, multifunctional, and cheaper. Correspondingly, all kinds of semiconductor manufacturing technologies are being rapidly developed in order to meet increasingly demanding user requirements. In mass production of semiconductor products, it is common for multiple semiconductor units to be manufactured on a common base substrate. The separate semiconductor units are arranged in an array on the substrate, and subsequently the substrate is broken into pieces to provide the individual semiconductor units. A process of breaking the substrate is a key technology in order to achieve high quality and maintain production efficiency. A yield rate of the breaking process is a key factor in considering the quality and efficiency of the breaking process.

Figure 12:
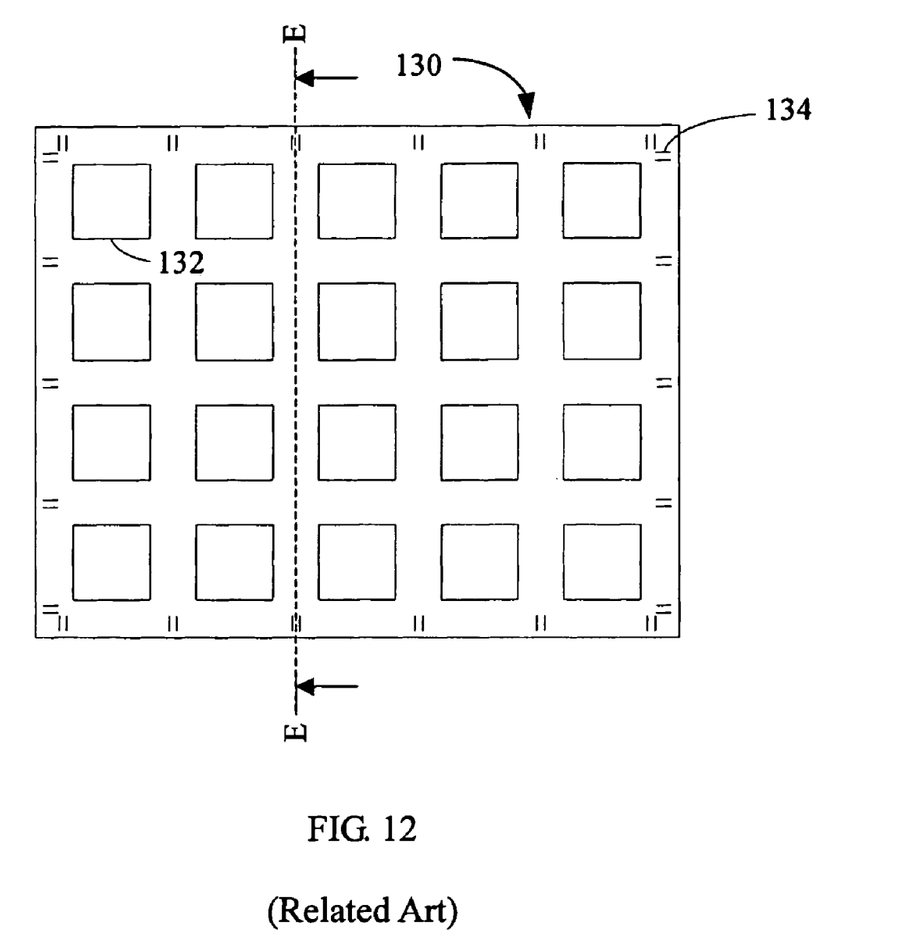
FIG. 12 is a top elevation view of a conventional ceramic substrate.
Figure 13:
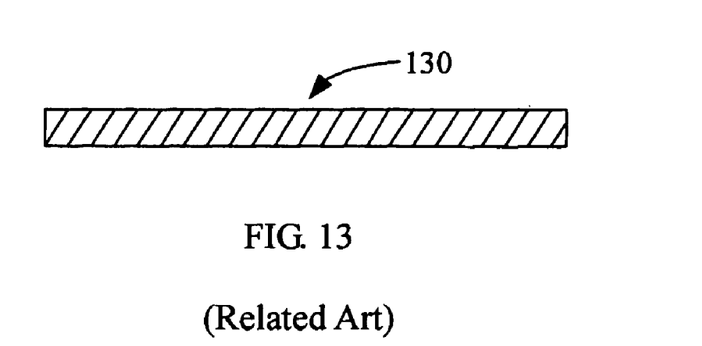
FIG. 13 is a cross-sectional view taken along line E-E of FIG. 12.
Figure 14:
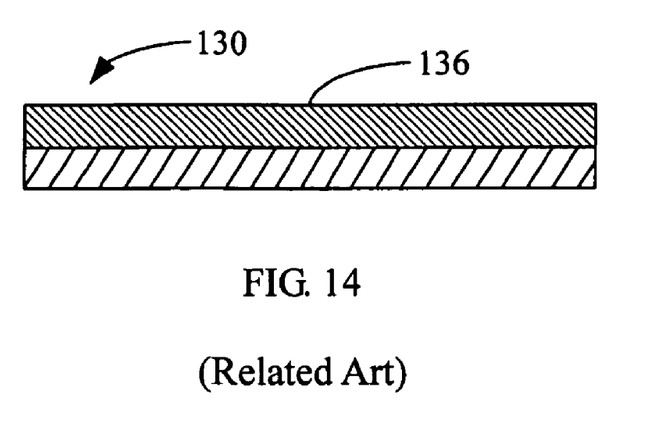
FIG. 14 is similar to FIG. 13, but showing compound covered on a top surface of the ceramic substrate, in accordance with a conventional method.
Figure 15:
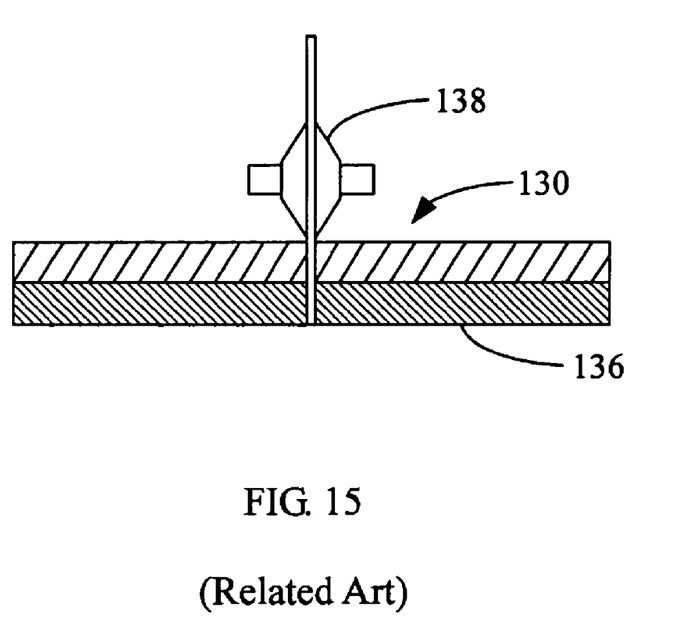
FIG. 15 is similar to FIG. 14, but showing the ceramic substrate inverted, and a cutter cutting the ceramic substrate in accordance with the conventional method.

Conventional ceramic substrates, especially ceramic substrates covered with protective compound, are divided by incising. A top elevation view of a conventional ceramic substrate 130 is shown in FIG. 12. The ceramic substrate 130 is embedded with a plurality of circuit units 132. The layout of a bottom surface of the ceramic substrate 130 is the same as that of a top surface of the ceramic substrate 130. A plurality of identification marks 134 are arranged around edges of the top surface and the bottom surface of the ceramic substrate 130. Most of the identification marks 134 correspond to clearances between adjacent circuit units 132. FIG. 13 is a cross-sectional view taken along line E-E of FIG. 12. Further referring to FIG. 14, the top surface of the ceramic substrate 130 is covered with protective compound 136, for sealing the ceramic substrate 130 and preventing the circuit units 132 from being degraded by exposure to air. Because the identification marks 134 on the top surface of the ceramic substrate 130 are covered by the protective compound 136, the circuit units 132 can be divided into individual units only by reference to the identification marks 134 exposed on the bottom surface of the ceramic substrate 130. FIG. 15 shows a cutter 138 cutting the ceramic substrate 130. The cutter 138 sequentially cuts the ceramic substrate 130 and the protective compound 136 according to the identification marks 134 on the bottom surface.

The above-described method generally causes the ceramic substrate 130 to be split as desired. However, the cutter 138 may be seriously damaged by abrasion during the cutting process, due to the hardness of the ceramic substrate 130. Correspondingly, the production costs are increased. Besides, the ceramic substrate 130 is easily to be cracked during the cutting process because of its brittleness.

Therefore, a heretofore unaddressed need exists in the industry to overcome the aforementioned deficiencies and inadequacies.

SUMMARY

A ceramic substrate includes a top surface, a plurality of identification marks, a protective compound, a bottom surface, and a plurality of grooves. The top surface includes a first area and a second area. The first area is defined at one or more edges portions of the top surface. The second area is defined inside the first area. The identification marks are arranged on the first area. The protective compound is covered on the second area. The grooves are defined at the bottom surface, and correspond to the identification marks.

A ceramic substrate breaking method according to another embodiment is provided. The ceramic substrate includes a top surface and a bottom surface. The top surface includes a first area located at one or more edges portions thereof, a second area located inside the first area, and a plurality of identification marks arranged on the first area. A plurality of grooves corresponding to the identification marks is defined in the ceramic substrate at the bottom surface. The breaking method includes: (a) covering the protective compound on the second area of the top surface of the ceramic substrate; (b) cutting the protective compound according to the identification marks on the top surface of the ceramic substrate; and (c) breaking the ceramic substrate into individual circuit unit pieces along the grooves.

A ceramic substrate breaking method according to still another embodiment is provided. The ceramic substrate includes a top surface and a bottom surface. The top surface includes a first area located at one or more edges portions thereof, a second area located inside the first area, and a plurality of identification marks arranged on the first area. A plurality of circuit units are embedded in the ceramic substrate at the second area. A plurality of grooves corresponding to the identification marks is defined in the ceramic substrate at the bottom surface. The breaking method includes: (a) pasting one or more tapes on the first area of the top surface of the ceramic substrate; (b) covering the protective compound on the second area of the top surface of the ceramic substrate; (c) removing the tapes; (d) cutting the protective compound according to the identification marks on the top surface of the ceramic substrate; and (e) breaking the ceramic substrate into individual circuit unit pieces along the grooves at the bottom surface of the ceramic substrate.

According to the above-described embodiments, the identification marks are exposed when the protective compound covers the top surface of the ceramic substrate. The cutter cuts away the protective compound on the ceramic substrate according to the identification marks arranged on the top surface. The cutter need not cut the ceramic substrate directly. Therefore, abrasion of the cutter can be significantly reduced. Correspondingly, production costs are reduced.

Other advantages and novel features will be drawn from the following detailed description of preferred embodiments with the attached drawings, in which:

DETAILED DESCRIPTION OF EXEMPLARY EMBODIMENTS

Figure 1:
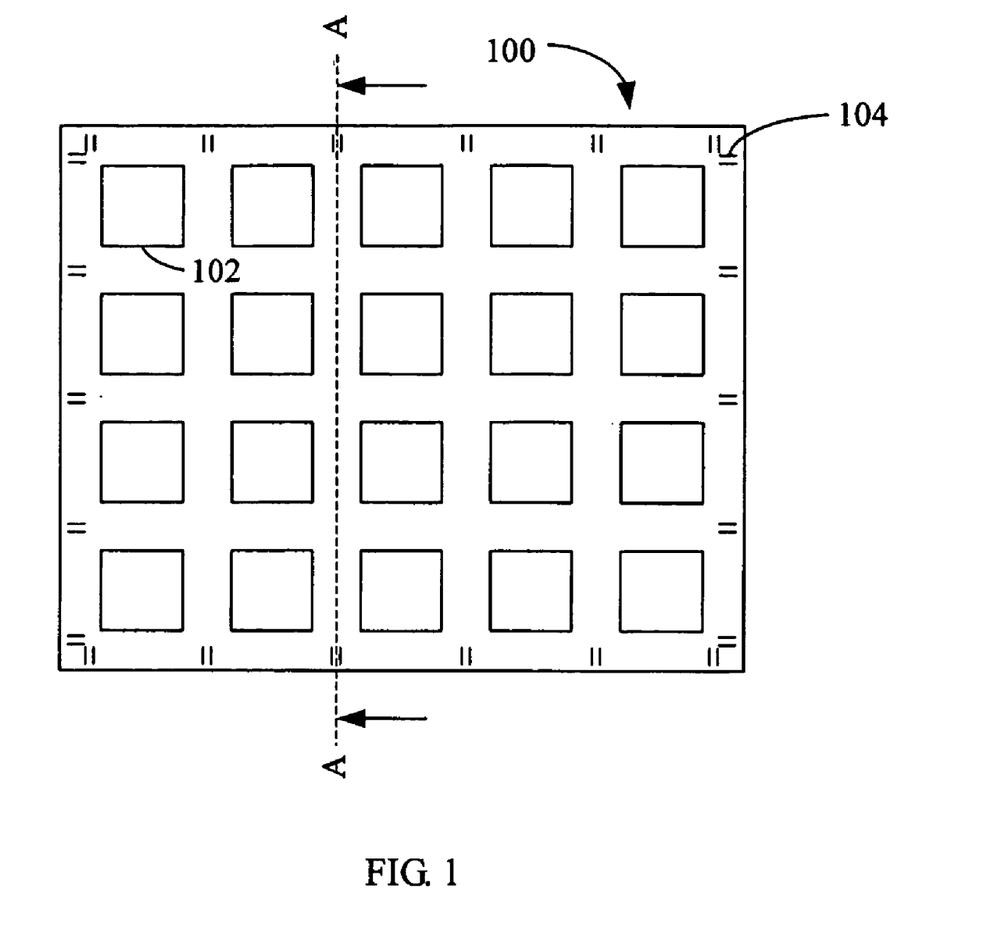
FIG. 1 is a top elevation view of a ceramic substrate in accordance with a first exemplary embodiment of the present invention.
Figure 2:
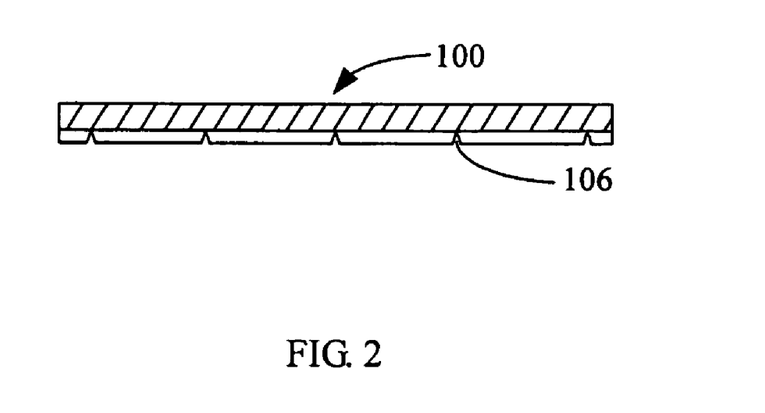
FIG. 2 is a cross-sectional view taken along line A-A of FIG. 1.

FIG. 1 shows a top elevation view of a ceramic substrate 100 according to a first exemplary embodiment of the present invention. A plurality of circuit units 102 are embedded in the ceramic substrate 100. A plurality of identification marks 104 are arranged around edges of a top surface of the ceramic substrate 100. Most of the identification marks 104 correspond to clearances between adjacent circuit units 102. In the exemplary embodiment, one area of the top surface containing the identification marks 104 is defined as a first area. The first area is a peripheral area. Another area of the top surface, which is within the first area and which contains the circuit units 102, is defined as a second area. The identification marks 104 are used for identifying and confirming exact positions of the circuit units 102. FIG. 2 shows a cross-sectional view of the ceramic substrate 100 taken along line A-A of FIG. 1. The layout of a bottom surface of the ceramic substrate 100 is similar to that of the top surface of the ceramic substrate 100. However, the bottom surface of the ceramic substrate 100 defines a plurality of transverse and lengthwise V-shape grooves 106 aligned between the circuit units 120. The V-shape grooves 106 at the bottom surface correspond in position to the identification marks 104 on the top surface of the ceramic substrate 100.

Figure 3:
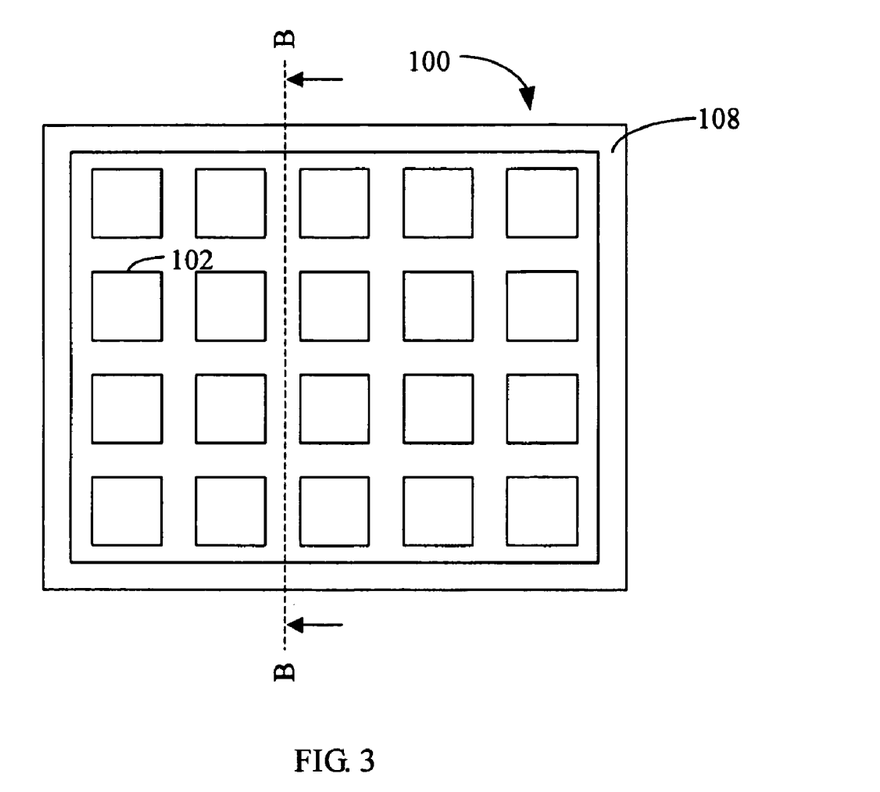
FIG. 3 is similar to FIG. 1, but showing one or more tapes pasted on four top surface edge portions of the ceramic substrate, in accordance with a first exemplary method of the present invention.
Figure 4:
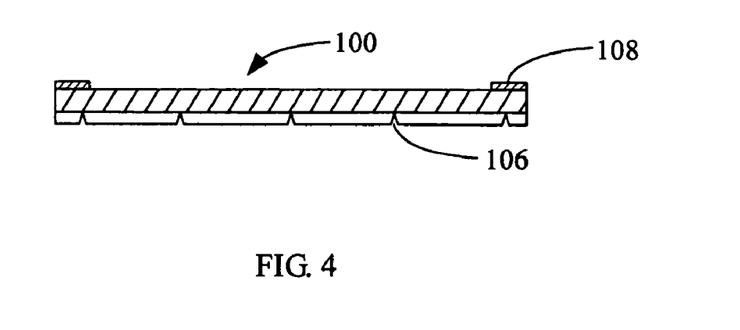
FIG. 4 is a cross-sectional view taken along line B-B of FIG. 3.
Figure 5:
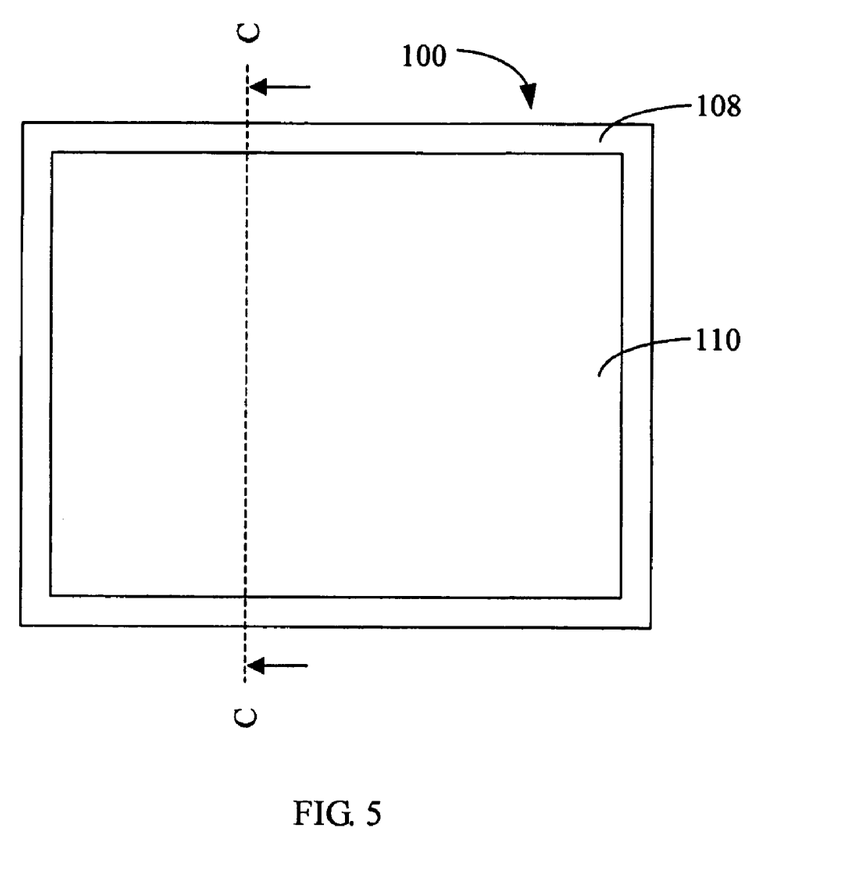
FIG. 5 is similar to FIG. 3, but showing protective compound covered on the top surface of the ceramic substrate inside the tapes, in accordance with the first exemplary method.
Figure 6:
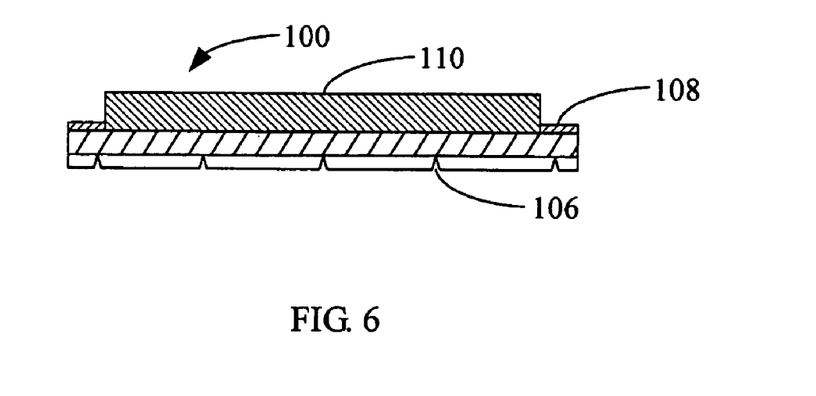
FIG. 6 is a cross-sectional view taken along line C-C of FIG. 5.
Figure 7:
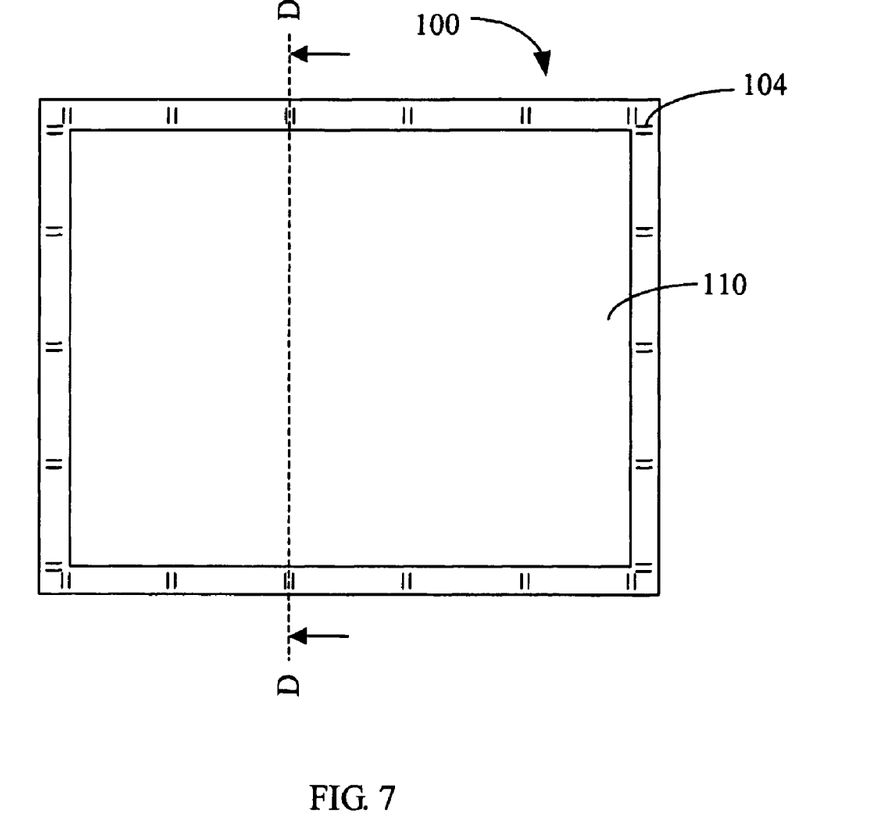
FIG. 7 is similar to FIG. 5, but showing the ceramic substrate after the tapes have been removed from the top surface thereof, in accordance with the first exemplary method.
Figure 8:
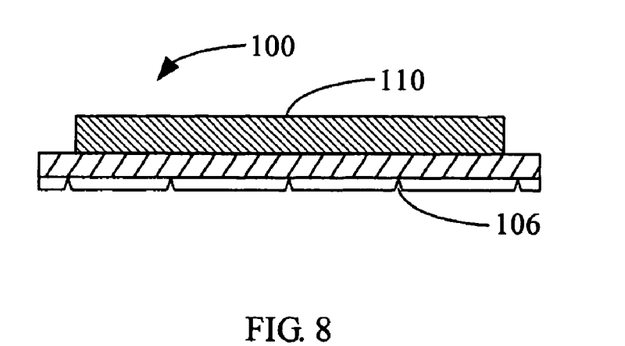
FIG. 8 is a cross-sectional view taken along line D-D of FIG. 7.
Figure 9:
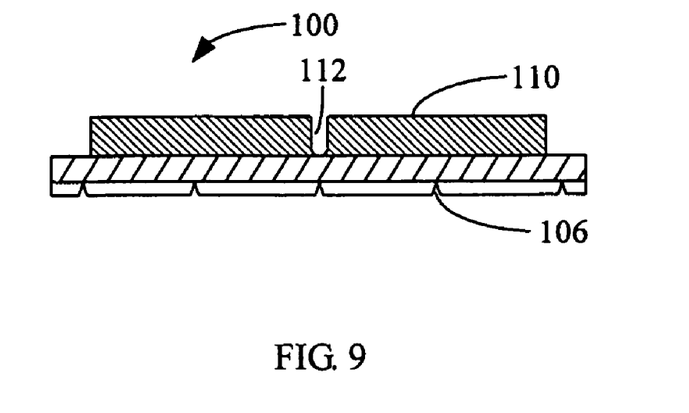
FIG. 9 is similar to FIG. 8, but showing the ceramic substrate after the protective compound on the top surface thereof has been cut, in accordance with the first exemplary method.

A first exemplary method for breaking the ceramic substrate 100 is as follows. As shown in FIG. 3, the first area of the top surface of the ceramic substrate 100 is pasted with one or more tapes 108. In the exemplary embodiment, the tapes 108 do not cover the circuit units 102. FIG. 4 shows a cross-sectional view of the ceramic substrate 100 taken along line B-B of FIG. 3. Next, as shown in FIG. 5, the second area of the top surface of the ceramic 100 is covered with protective compound 110 in order to seal the ceramic substrate 110 and prevent the circuit units 102 from being degraded by exposure to air. FIG. 6 shows a cross-sectional view of the ceramic substrate 100 taken along line C-C of FIG. 5. Subsequently, as shown in FIG. 7, the tapes 108 on the first area of the top surface of the ceramic substrate 100 are removed. FIG. 8 shows a cross-sectional view of the ceramic substrate 100 taken along line D-D of FIG. 7. Next, as shown in FIG. 9, portions of the protective compound 110 on the second area of the top surface of the ceramic substrate 100 are cut away by a cutter according the identification marks 104, thereby forming cutting grooves 112 in the protective compound 110. The cutting grooves 112 at the top surface correspond to the V-shape grooves 106 at the bottom surface. A depth of the cutting grooves 112 is generally equal to a thickness of the protective compound 110. Finally, the ceramic substrate 100 is broken into individual circuit unit pieces along the V-shape grooves 106 of the bottom surface by applied external force, such as by way of manual snapping by a production line worker. In the exemplary embodiment, a depth of the V-shape grooves 106 is generally greater than or equal to ⅓a thickness of the ceramic substrate 100.

In the exemplary embodiment, the cutter cuts away protective compound 110 only, and does not cut the ceramic substrate 100. Therefore, the cutter does not readily sustain damage or wear. In addition, the ceramic substrate 100 is broken easily, due to the cutting grooves 112 and the V-shaped grooves 106 being respectively arranged at the top surface and the bottom surface of the ceramic substrate 100. Further, if desired, the depth of the cutting grooves 112 can be greater than the thickness of the protective compound 110, such that the ceramic substrate 100 itself is partially cut by the cutter. In such case, the cut ceramic substrate 100 facilitates the subsequent breakage of the ceramic substrate 100 into the individual circuit unit pieces.

Figure 10:
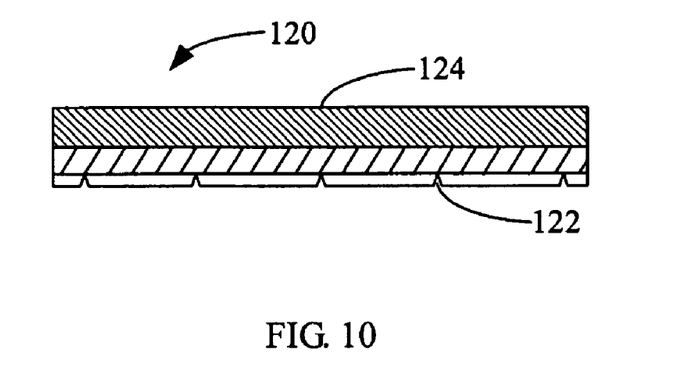
FIG. 10 is a side cross-sectional view of protective compound covered on a top surface of a ceramic substrate, in accordance with a second exemplary method of the present invention.
Figure 11:
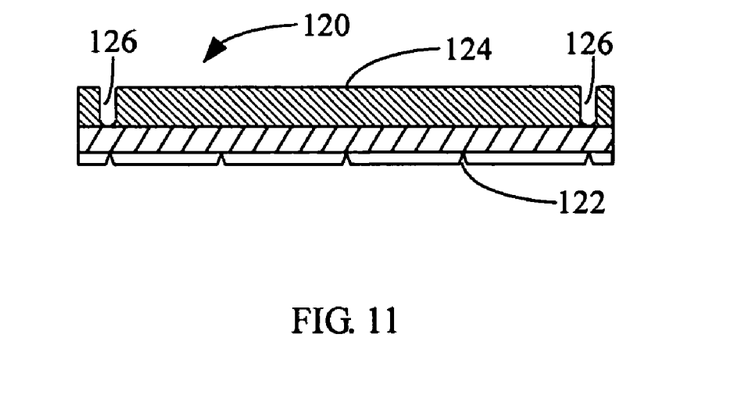
FIG. 11 is similar to FIG. 10, but showing the protective compound cut along one or more peripheral portions of the top surface of the ceramic substrate, in accordance with the second exemplary method.

A second exemplary method for breaking a ceramic substrate is as follows. Referring to FIG. 10 and FIG. 11, these schematically illustrate a ceramic substrate 120. A configuration of the ceramic substrate 120 is the same as that of the ceramic substrate 100. A plurality of V-shaped grooves 122 is defined in the ceramic substrate 120 at a bottom surface thereof. In the method, firstly, as shown in FIG. 10, a top surface of the ceramic substrate 120 is entirely covered with protective compound 124. Secondly, as shown in FIG. 11, the protective compound 124 is cut away along one or more borders between the first area and the second area of the top surface. One or more cutting grooves 126 are thereby formed in the protective compound 124. A depth of the cutting grooves 126 is substantially equal to a thickness of the protective compound 124. Alternatively, the depth of the cutting grooves 126 may be greater than the thickness of the protective compound 124. Thirdly, the protective compound 126 on the first area of the top surface of the ceramic substrate 120 is removed, thereby exposing the identification marks 104. Subsequent steps are essentially the same as those described above in relation to the first exemplary method.

While particular embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

We claim:

1. A ceramic substrate breaking method, wherein the ceramic substrate comprises a top surface and a bottom surface, the top surface defining a first area located at one or more edge portions thereof and a second area located inside the first area, a plurality of identification marks arranged on the first area, the bottom surface defining a plurality of grooves corresponding to the identification marks, the method comprising the steps of:
- (a) covering a protective compound on the second area of the top surface of the ceramic substrate;
- (b) cutting the protective compound according to the identification marks on the top surface of the ceramic substrate; and
- (c) breaking the ceramic substrate into individual circuit unit pieces along the grooves.

2. The ceramic substrate breaking method as recited in claim 1, wherein the second area of the ceramic substrate has a plurality of circuit units embedded thereat.

3. The ceramic substrate breaking method as recited in claim 1, wherein step (a) comprises:
- (a1) pasting one or more tapes on the first area of the top surface of the ceramic substrate;
- (a2) covering the protective compound on the second area of the top surface of the ceramic substrate; and
- (a3) removing the tapes.

4. The ceramic substrate breaking method as recited in claim 1, wherein a cutting depth in step (b) is substantially equal to or greater than a thickness of the protective compound.

5. The ceramic substrate breaking method as recited in claim 1, wherein a depth of the grooves is approximately equal to ⅕ a thickness of the ceramic substrate or greater than ⅕ the thickness of the ceramic substrate.

6. The ceramic substrate breaking method as recited in claim 1, wherein step (a) comprises:
- (a11) covering the protective compound on the top surface of the ceramic substrate;
- (a22) cutting the protective compound along one or more borders between the first area and the second area of the top surface of the ceramic substrate; and
- (a33) removing the protective compound from the first area in order to expose the identification marks.

7. The ceramic substrate breaking method as recited in claim 6, wherein a cutting depth in step (a22) is substantially equal to or greater than a thickness of the protective compound.

8. A ceramic substrate breaking method, wherein the ceramic substrate comprises a top surface and a bottom surface, the top surface defining a first area located at one or more edge portions thereof, and a second area located inside the first area, a plurality of identification marks arranged on the first area, a plurality of circuit units embedded at the second area, the bottom surface defining a plurality of grooves corresponding to the identification marks, wherein at least two of the identification marks correspond to clearances between adjacent circuit units, the method comprising the steps of:
- (a) pasting one or more tapes on the first area of the top surface of the ceramic substrate;
- (b) covering the protective compound on the second area of the top surface of the ceramic substrate;
- (c) removing the tapes;
- (d) cutting the protective compound according to the identification marks; and
- (e) breaking the ceramic substrate into individual circuit unit pieces along the grooves at the bottom surface of the ceramic substrate.

9. The ceramic substrate breaking method as recited in claim 8, wherein a cutting depth in step (d) is approximately equal to or greater than a thickness of the protective compound.

10. The ceramic substrate breaking method as recited in claim 8, wherein a depth of the grooves is approximately equal to ⅕ a thickness of the ceramic substrate or greater than ⅕ the thickness of the ceramic substrate.

11. A method for breaking a ceramic substrate with circuit units therein comprising:
- defining a first area at one surface of said ceramic substrate without circuit units located therein, and a second area at said one surface of said ceramic substrate with said circuit units spreading therein, a plurality of identification marks arranged on said first area to indicate breaking directions for separating said circuit units;
- forming a plurality of V-shaped grooves corresponding to said plurality of identification marks on another surface of said ceramic substrate opposite to said one surface thereof;
- after forming said plurality of V-shaped grooves, covering a protective compound on said second area of said one surface of said ceramic substrate by revealing said plurality of identification marks on said first area of said one surface;
- cutting said protective compound to form cutting grooves according to said plurality of identification marks revealed on said first area; and
- breaking said ceramic substrate into pieces for separating said circuit units along said cutting grooves.

12. The method as recited in claim 11, wherein said plurality of identification marks on said first area are revealed by pasting tapes on said first area before said protective compound covers said second area.

13. The method as recited in claim 11, wherein said plurality of identification marks on said first area are revealed by removing said protective compound applied on said first area after said protective compound covers said second area.

14. The method as recited in claim 11, wherein each of said plurality of identification marks corresponds to a clearance between adjacent circuit units.

* * * * *